United States Patent
Marion

(10) Patent No.: US 8,291,586 B2
(45) Date of Patent: Oct. 23, 2012

(54) METHOD FOR BONDING TWO ELECTRONIC COMPONENTS

(75) Inventor: Francois Marion, Saint Martin le Vinoux (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 164 days.

(21) Appl. No.: 12/852,726

(22) Filed: Aug. 9, 2010

(65) Prior Publication Data

US 2011/0035925 A1 Feb. 17, 2011

(30) Foreign Application Priority Data

Aug. 13, 2009 (FR) .................................. 09.55657

(51) Int. Cl.
*H05K 3/00* (2006.01)
*H01L 21/00* (2006.01)

(52) U.S. Cl. ............................................. 29/843; 29/860

(58) Field of Classification Search ............... 29/843, 29/860; 257/738; 228/180.21
See application file for complete search history.

(56) References Cited

U.S. PATENT DOCUMENTS

| | | | |
|---|---|---|---|
| 5,329,423 A * | 7/1994 | Scholz ........................... | 361/760 |
| 5,767,580 A | 6/1998 | Rostoker | |
| 6,007,349 A * | 12/1999 | Distefano et al. ............... | 439/71 |
| 6,130,148 A | 10/2000 | Farnworth et al. | |
| 7,135,771 B1 * | 11/2006 | Khandekar et al. ........... | 257/737 |
| 7,514,788 B2 * | 4/2009 | Kobae et al. ................... | 257/738 |
| 7,569,939 B2 * | 8/2009 | Khandekar et al. ........... | 257/778 |
| 2006/0231953 A1 | 10/2006 | Murata et al. | |
| 2006/0278966 A1 | 12/2006 | Trezza et al. | |
| 2008/0190655 A1 | 8/2008 | Davoine et al. | |

FOREIGN PATENT DOCUMENTS

FR 2 928 033 A1 8/2009
WO 2006/054005 A1 5/2006

* cited by examiner

*Primary Examiner* — Jermie Cozart
(74) *Attorney, Agent, or Firm* — Burr & Brown

(57) ABSTRACT

A method for bonding two electronic components includes inserting hollow and open inserts into full convex elements of a lower hardness than that of the inserts, where, when an insert is inserted into a full element at least one surface of the open end of the insert is left free from the full element so as to create an outlet passage for gases contained in the insert.

5 Claims, 2 Drawing Sheets

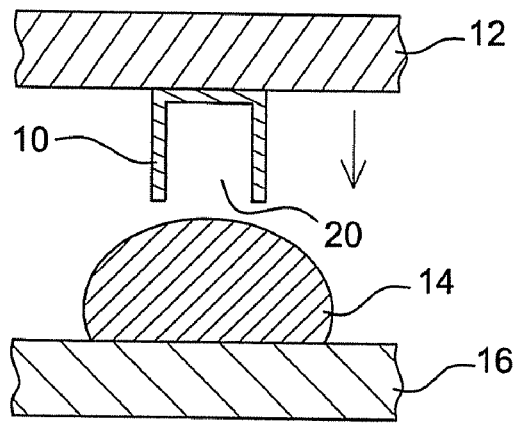
Fig. 1
PRIOR ART
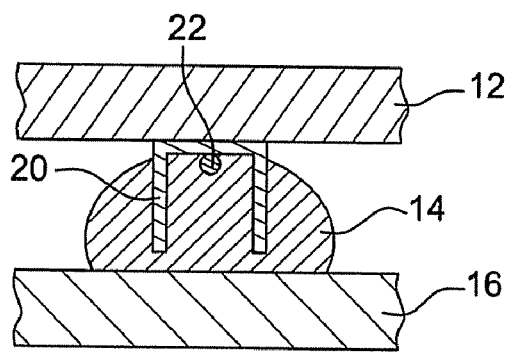
Fig. 2
PRIOR ART
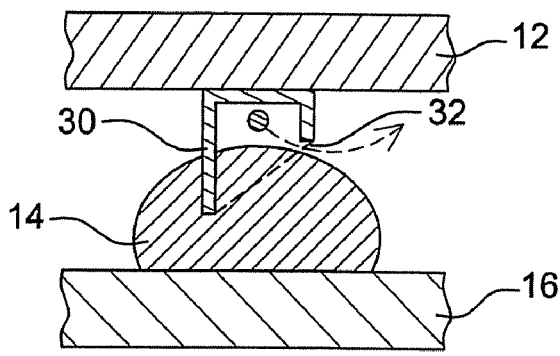 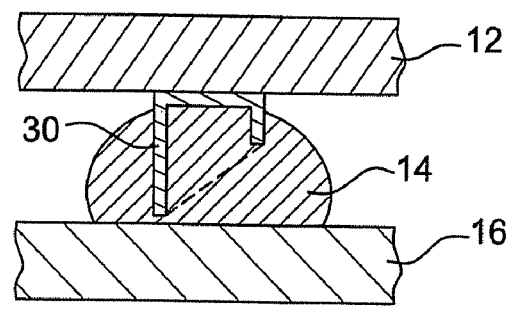
Fig. 3          Fig. 4
PRIOR ART          PRIOR ART

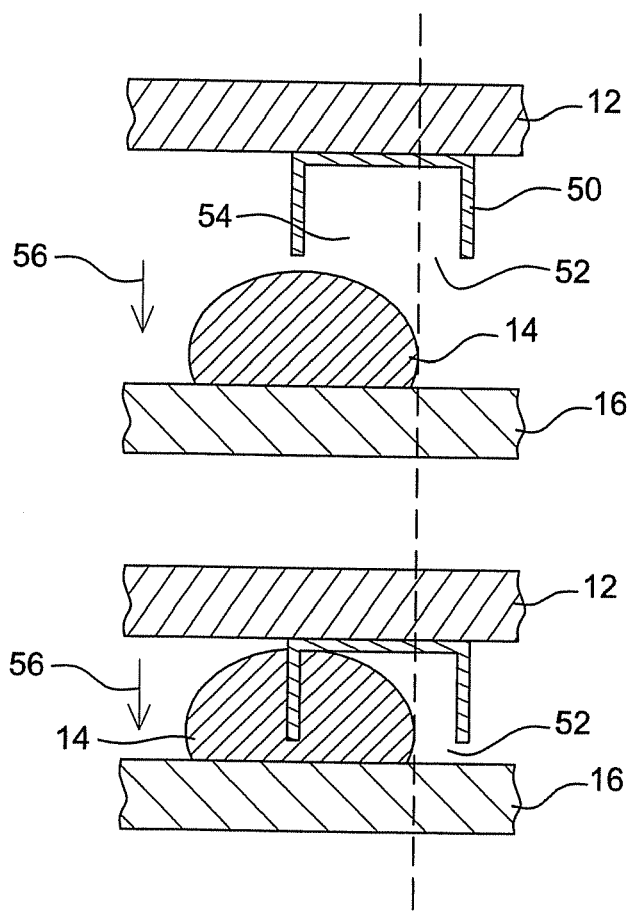
Fig. 5
Fig. 6
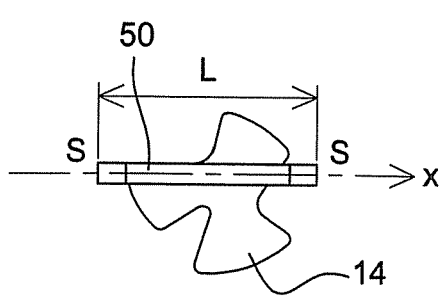
Fig. 7
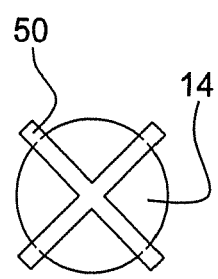
Fig. 8
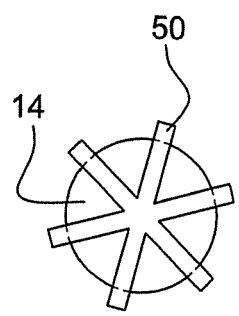
Fig. 9
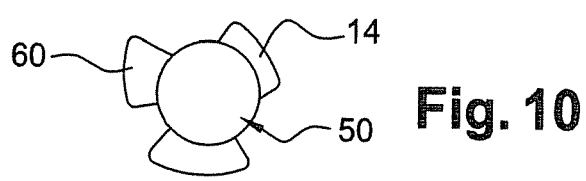
Fig. 10

METHOD FOR BONDING TWO ELECTRONIC COMPONENTS

FIELD OF THE INVENTION

The invention relates to the field of microelectronics, and to be more specific to the bonding of two electronic components using the so-called thermo-compression flip-chip technique.

The invention can be used to advantage in devices that require very fine pitch metal pattern interconnects, in particular for the manufacture of very large-scale very fine pitch imaging devices, such as for example large-sized heterogeneous detector matrices including a large number of connections, temperature-sensitive and cold-hybridized detector matrices, or detector matrices sensitive to mechanical stress.

PRIOR ART

The so-called thermo-compression flip-chip bonding technique commonly comprises forming electrically conductive beads on one face of a first electronic component and on one face of a second component according to a predetermined connection pattern. The first component is then transferred onto the second component so as to bring the respective solder beads thereof into line and then the assembly is pressed and heated. The beads brought into contact distort and fuse to form electrical connections perpendicular to the main plane of the electronic components, generally in the form of a wafer.

Furthermore the miniaturization of electronic devices has led to a multiplication of the electrical connections required per unit area. This being the case the compression of a first component onto a second component using this technique has required ever greater compression pressure thereby causing a loss of control over the crushing of the beads.

To overcome this difficulty, the beads provided on the face of one of the components have been replaced by a protuberance of small cross-section made out of a material that is harder than that constituting the beads. When the components are compressed, these protuberances break the native oxide of the beads of the other component, and do so even at low temperature, by means of a smaller bearing section. A reduction in the pressure exerted, or a larger number of connections per unit area for one and the same pressure, is thus obtained. In conjunction, the compression requires a lower temperature and better control is obtained over the crushing of the beads. Reference may be made for example to the document WO 2006/054005 for further details.

Even though an appreciable gain in pressure is obtained relative to the first flip-chip technique, the fact remains nonetheless that the pressure required increases as the number of connections per unit area increases. In fact, this flip-chip technique by insertion of hard protuberances into beads is, in the end, subject to the same limitations.

To further reduce the requisite pressure during thermo-compression, the protuberances, constituted by full elements, have been replaced by hollow and open inserts. The seat of the inserts on the beads is thus restricted to the surface of the aperture. Reference may be made to advantage to the document FR 08 51142 for further details.

FIGS. 1 and 2 show a problem inherent with this type of flip-chip technique using hollow and open inserts.

In FIG. 1, a hollow and open, and for example cylindrical, insert 10 is placed on one face of a first electronic component 12 opposite a bead 14 placed on one face of a second electronic component 16 and of lower hardness than the insert 10. During thermo-compression, the insert 10 is inserted into the bead 14 in the direction of the arrow shown.

Once the aperture 20 of the insert 10 is introduced into the bead 14, there is no longer any passage through which the gas included in the insert 10 is able to escape. Once the insertion is complete (FIG. 2), the trapped gas forms a bubble 22 of compressed gas. This volume of parasitic gas causes problems of reliability during subsequent thermal cycles and particularly significant degassing problems when the electronic device so produced is to operate in a vacuum.

To overcome this compressed gas bubble problem, bevelled cylindrical inserts have been designed, as is shown in FIGS. 3 and 4. An insert of this kind 30 is then inserted into the bead 14 in two steps. In a first step, shown in FIG. 3, the bevelled insert 30 is partially inserted into the bead 14 so as to leave a gas leak passage 32. The assembly is then put into a vacuum so that the gas present in the insert 30 can be discharged and the insertion is finalized in a vacuum. Reference may be made to advantage to the aforementioned document FR 08 51142 for further detail.

The compressed gas bubble problem is thus resolved, however, this technique requires the use of a bevelled insert, which is more complex to fabricate than a non-bevelled insert, and the implementation of two different steps (pre-insertion and insertion in a vacuum) reducing the fabrication yield of the assembly. Additionally, this technique requires the use of an additional vacuum pump.

BACKGROUND OF THE INVENTION

The purpose of the invention is to propose a method for bonding two electronic components by the insertion of hollow and open inserts into full elements, allowing an insertion under ambient atmosphere and without creating bubbles.

To this end, the invention is characterized in that, when an insert is inserted into a full convex element, at least one surface of the open end of the insert is left free (i.e., not in contact with the full element) so as to create an outlet passage for gases contained in the insert.

"Hollow insert" is here taken to mean a pattern protuberant from a surface, whereof the side walls form an internal open cavity, and whereof the thickness e of the walls is small relative to the dimensions of the cavity aperture, so as to define a small seat during the step of inserting the hollow insert into the full element, and therefore a small insertion force relative to the insertion of a full insert into a full element, thereby allowing the insert to be inserted into the full element under ambient atmosphere, with no thermo-compression or re-fusion step.

As a numerical example, the surface S' defined by the walls of the hollow insert is smaller by at least half than the surface S of the cross-section of the hollow insert (S'<S/2). For example, in the case of a hollow tubular insert, the thickness e of the walls is less than a fifth of the external diameter D of the insert (e<D/5). Reference may be made to the application FR 08 51142 for an example of the determination of the thickness e of the walls of the hollow tubular insert relative to the insertion force of the hollow insert into the full element.

In a preferred way, the hollow insert is constituted by a thin film closed on itself with the cross-section thereof being small relative to the cross-section of the aperture.

In other words, a portion of the aperture of the insert is laterally offset from the full element with the result that this portion is never inserted therein. There is thus a passage for the gases to be expelled from between the insert and the full element during insertion. According to particular embodiments of the invention, the method includes one of more of the following features:

the open end of the insert is of greater length, along at least one predetermined axis, than the length of the full element along said at least one axis;

the open end of the insert has a plurality of branches partially arranged outside the full element during insertion;

the open end of the insert is circular;

the full elements form a pattern on one surface of one of the micro-components, in that the inserts form a pattern on one surface of the other of the micro-components, and the insertion is implemented by offsetting one pattern relative to the other so as to create an outlet passage for the gases in respect of each insert.

BRIEF DESCRIPTION OF THE DRAWINGS

The invention will be better understood from reading the following description, given solely by way of example, and given in relation to the appended drawings, wherein identical reference numbers denote identical or similar elements, and wherein:

FIGS. 1 and 2 are cross-section views showing the insertion of a hollow and open insert into a bead according to a first prior art technique, these figures having been described in the introduction;

FIGS. 3 and 4 are cross-section views showing the insertion of a hollow and open insert into a bead according to a second prior art technique, these figures having been described in the introduction;

FIGS. 5 and 6 are cross-section views showing the insertion of a hollow and open insert into a bead in accordance with the invention;

FIGS. 7 to 10 show preferred forms of inventive inserts.

DETAILED DESCRIPTION OF THE INVENTION

With reference to FIGS. 5 and 6, when bonding a first electronic component 12 to a second electronic component 16, each hollow and open insert 50 of the first component 12 is arranged in line with a full connection element 14 of the second component 16, for example a solder bead, in such a way that a portion 52 of the aperture 54 of the insert 50 is not opposite the element 14 (FIG. 5).

In fact, when the insert 50 is inserted into the element 14 in the direction of the arrow 56 (FIG. 6), there is still a passage for the gas contained in the insert 50. Thus no bubble remains trapped therein during insertion and/or after bonding.

In a first alternative, the patterns formed by the inserts 50 on the face of the component 12 are offset relative to the pattern formed by the elements 14 on the face of the component 16. The patterns are thus offset for example during fabrication of the components 12 and 16 and the components are then aligned conventionally, or the inserts 50 and the elements 14 are fabricated conventionally and the components 12 and 16 are then offset during insertion.

This first alternative allows in particular conventional prior art patterns to be used, the offsetting thereof creating gas leak passages.

The portion 52 is thus for example of the order of 1 to 2 μM, even if the full connection elements 14 are substantially distributed every 50 μm.

In a second alternative, which may be combined with the first alternative, the dimensions and shapes of the inserts are designed to create said passages.

FIGS. 7 to 10 are views from above of preferred shapes of the inserts and elements 14. In a first preferred shape shown in FIG. 7, the insert 50 assumes the shape of a hollow and open bar whereof the length L of the insert 50 along an axis x is greater than the length of the full element 14 along said axis. The element 14 may for its part assume any shape. The insert 50 thus protrudes on each side from the element 50, thereby creating two passages for the gases.

In a second preferred shape shown in FIGS. 8 and 9, the insert 50 comprises a plurality of branches, and assumes the shape for example of a cross (FIG. 8) or of a star (FIG. 9), the ends of each branch protruding from the element 14. Each branch thus defines a passage for the gases. Since the number of passages is multiplied, the risk of creating a bubble in the insert, owing for example to a defect on the surface of the element 14 or in the insert itself, is minimized. The full element 14 may assume any shape but to advantage is spherical or ellipsoidal in shape.

In a third preferred shape shown in FIG. 10, the insert 50 is cylindrical and the full element comprises lobes 60, the insert 50 being centered, not necessarily exactly, at the point where the lobes 60 meet.

Clearly other embodiments, in terms of both shape and dimensions, are possible so long as at least one passage is available for the gases when the insert is inserted into the full element.

The hollow insert is to advantage constituted by a hard material, such as in particular W, WSi, TiN, Cu, Pt or Ni, coated with a layer of noble metal, such as in particular Au or Pt, in order to prevent the formation of surface oxide which would weaken the electrical contact with the full element. The full element is for its part preferably constituted by In or a composite based on In, such as for example InSb, an alloy based on tin, lead, Al or an alloy of Al, such as AlCu for example.

As a numerical example, the hollow insert is tubular in shape, its cross-section being a hollow disc, whereof the thickness e of the walls, for example constituted by a film, is equal to 0.2 micrometers and whereof the external diameter D is 3.6 micrometers. In a case such as this, the condition S'<S/2 is fulfilled, as is the condition e<D/5.

As mentioned earlier, the insertion of hollow inserts into full elements is used to join together a first and a second electronic component using the so-called flip-chip technique wherein a plurality of connections is formed. As is known per se, the connections are commonly arranged in the form of a matrix of connections whereof the connections are spaced out by a constant pitch p.

In a preferred way, the dimensions of the hollow tubular inserts are defined relative to the pitch p of the matrix of connections. To be more specific, the height Ht of the insert is equal to p/4, the external diameter D of the hollow tubular insert is equal to p/2,5, and the thickness e of the walls of the hollow tubular insert is equal to D/20 if p≦10 μm.

The full elements are for their part of elliptical cross-section, with the major axis Dmax thereof being larger by at least 10% than the external diameter D of the hollow inserts and the minor axis thereof being smaller by at least 10% than the diameter D in order to create outlet passages for the gases.

The numerical values summarized in the following table are thus obtained.

| p (μm) | D (μm) | e (μm) | S' (μm$^2$) | S (μm$^2$) | S/S' | Ht (μm) | Dmax (μm) |
|---|---|---|---|---|---|---|---|
| 100 | 40 | 0.4 | 50.24 | 1256 | 25 | 25 | 44 |
| 10 | 4 | 0.2 | 2.512 | 12.56 | 5 | 2.5 | 4.4 |
| 5 | 2 | 0.1 | 0.628 | 3.14 | 5 | 1.5 | 2.2 |
| 2.5 | 1 | 0.05 | 0.157 | 0.785 | 5 | 0.625 | 1.1 |

The invention claimed is:

1. A method for bonding two electronic components by the insertion of hollow and open inserts into full convex elements having a lower hardness than that of the inserts, wherein when an insert is inserted into a full element, at least one surface of the open end of the insert is not in contact with the full element after bonding said two electronic components together, so as to create an outlet passage for gases contained in the insert.

2. The method for bonding two electronic components as claimed in claim 1, wherein the open end of the insert is of greater in length, than the length of the full element along at least one predetermined axis.

3. The method for bonding two electronic components as claimed in claim 2, wherein the open end of the insert has a plurality of branches partially arranged outside the full element during the insertion.

4. The method for bonding two electronic components as claimed in claim 2, wherein the open end of the insert is circular.

5. The method for bonding two electronic components as claimed in claim 1, wherein the full elements form a pattern on one surface of one of the two electronic components, in that the inserts form a pattern on one surface of the other of the two electronic components, and in that the insertion is performed by offsetting one pattern relative to the other so as to create an outlet passage for the gases in respect of each insert.

* * * * *